United States Patent [19]

Höglund

[11] 4,117,418
[45] Sep. 26, 1978

[54] ELECTRIC AMPLIFIER

[76] Inventor: Lennart Harry Erik Höglund, S-163 60 Spanga, Lindalsvagen 5, Sweden

[21] Appl. No.: 759,480

[22] Filed: Jan. 14, 1977

[51] Int. Cl.² ............................ H03F 3/04; H03F 3/68
[52] U.S. Cl. ................................ 330/296; 330/124 R; 330/165; 330/199; 330/202; 330/264; 330/267; 330/295
[58] Field of Search ............ 330/22, 30 R, 40, 124 R, 330/165, 199, 202

[56] References Cited

U.S. PATENT DOCUMENTS

| | | | |
|---|---|---|---|
| 3,319,175 | 5/1967 | Dryden | 330/22 |
| 3,483,425 | 12/1969 | Yanishevsky | 330/40 |
| 3,599,136 | 5/1971 | Machamer | 330/30 R |
| 3,832,643 | 8/1974 | Van Heyningen et al. | 330/22 X |
| 3,961,280 | 6/1976 | Sompei | 330/22 X |

Primary Examiner—James B. Mullins
Attorney, Agent, or Firm—Fleit & Jacobson

[57] ABSTRACT

An electric amplifier useful for instance in simulators for strong electric signals, comprising several partial amplifiers so connected and voltage fed that they will amplify an interval each of the input voltage. Every partial amplifier comprises at least one amplification component and two gates, of which gates one is blocking those potentials applied to the component that are less than a given first value but is open for potentials exceeding said value while the other gate is open for potentials less than a given second value greater than said first value but is blocking the component for potentials exceeding said second value.

17 Claims, 11 Drawing Figures

ELECTRIC AMPLIFIER

The present invention relates to an electric amplifier which has proved to be very useful for example in simulators for strong electric signals. For this amplifier a circuit will be used, which makes it possible to get both low and very high effects at extremely high coefficients of efficiency. The amplifier is characterized thereby that several partial amplifiers containing transistors or radio tubes are used, whereby the coefficient of efficiency increases with the number of partial amplifiers. The ratio between output power and power dissipation is constant when the transistors or the radio tubes are connected in the usual way but in the new amplifier according to the invention the output power increases in relation to the power dissipation.

It is previously known that amplifier elements (active components), as for example triodes, tetrodes, pentodes and transistors, can be given such biasing voltages and drivings that they will work in class A, B, AB1, AB2 or C. Amplifier elements working in said classes are characterized foremost by the coefficient of efficiency obtained and the linearity.

The present invention relates to an amplifier with the above-mentioned active components so voltage-biased and driven that linearity as well as coefficient of efficiency will be very high.

Characteristic of the previously used and above-mentioned classes of amplifiers is that the voltage amplitude of the amplified signal is not greater than output voltage range of the amplifier element. By making the current in an amplifier element different from zero only within part of the voltage range of the element and the output voltage, very high coefficient of efficiency and linearity can be achieved.

Amplifying according to the principle of the invention can be accomplished in many different ways, characterized by different coefficients of efficiency. In order to obtain a high coefficient of efficiency the voltage across the amplifier element must be as small as possible during the time when it is current carrying. If the voltage is zero when the current is greatest (resistive load) then the losses will be minimized.

It is convenient to use an even number of steps for feeding voltage to the different partial or elementary amplifiers. A further improvement of the coefficient of efficiency can be achieved by arranging a transformer outlet so that all elementary amplifiers will get equal losses.

In order to load all the elementary amplifiers with equal great maximum current, they may, instead of being directly interconnected at the inlets and outlets, each be connected to its separate tap on transformers with the turns of winding so chosen, that the load impedance for each elementary amplifier will increase in proportion to its blocking voltage, which is also the feed- or battery-voltage.

The elementary amplifiers must in this case also get input voltages compensating the ratio of the output transformer. This can for example be done by using an input transformer with the same ratio as said output transformer. The blocking voltages may at the same time be so chosen that all elementary amplifiers will get the same power loss.

The same power dissipation (power loss) can be obtained even if the demand for equal great maximum current is not realized. If all turns of winding are chosen equal and especially equal to the number of turns of the secondary winding (ratio = 1), said transformers can be omitted and the blocking voltages be chosen according to the power dissipation demand. A further possibility is to choose all blocking voltages to be equal and choose the number of turns of winding so that the power dissipation demand is satisfied.

The character of the amplifier according to the present invention will be more clear from the enclosed claims.

The invention will now be described by way of some preferred embodiments with reference to the accompanying drawings, in which.

Figure 1:
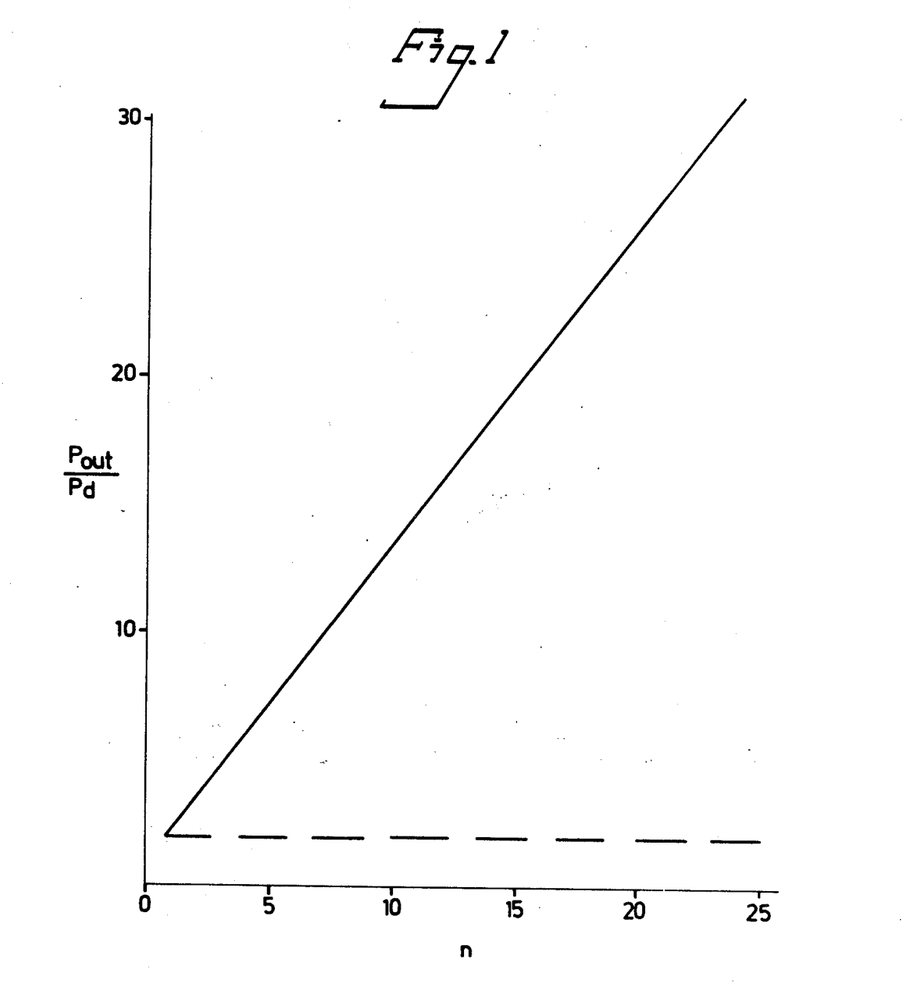
FIG. 1 is a diagram showing the ratio between the power output $P_{out}$ and the power dissipation (power loss) $P_d$ when connecting on one hand $n$ amplifying elements (transistors or radio tubes) in a known manner (dotted line) and when connecting on the other hand n elementary amplifiers in accordance with the invention (solid line)

Thus the diagram in FIG. 1 shows the ratio between the output power and the power dissipation (power loss) $P_{out}/P_d$ on the ordinate axis as a function of the number of amplifying elements respective elementary amplifiers $n$. It appears that by an arrangement according to the invention said ratio increases (solid line) while the ratio at already known circuits is mainly constant (dotted line).

Figures 2, 2A, 2B:
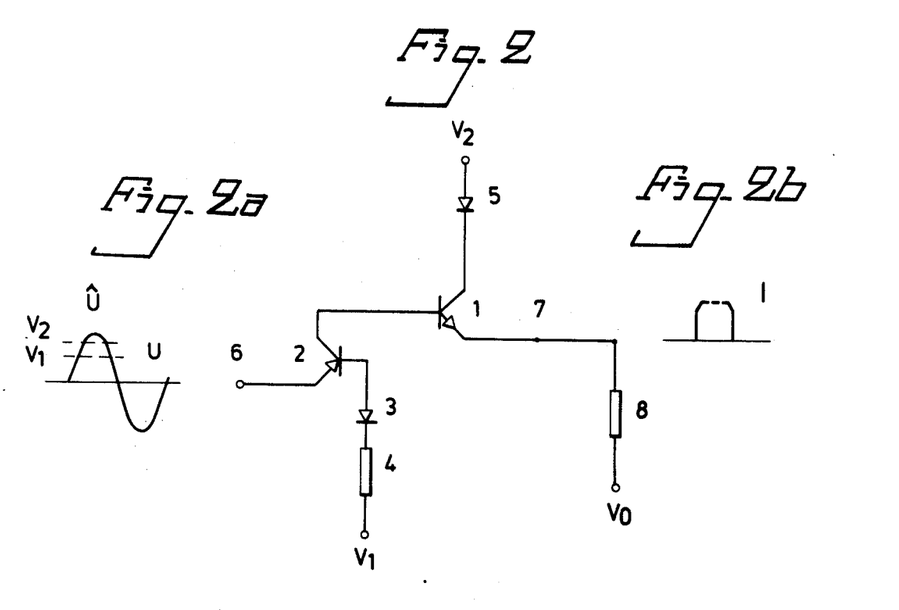
FIG. 2 shows the circuit of a transistorized elementary amplifier.
FIGS. 2a and 2b show the input voltage respective the output current corresponding to the amplified interval between the limiting voltages $V_1$ and $V_2$.

The elementary amplifier shown in FIG. 2 consists of a npn-transistor 1 functioning as amplifying element and two voltage gates, of which one consists of a pnp-transistor 2, whose emitter is connected to the input voltage, shown in FIG. 2a, and whose base is connected to the lower voltage limit $V_1$ via a diode 3 and a resistance 4 connected in series with said diode, while the collector is connected to the base of the amplification element 1. The second gate consists of a diode 5, which is connected between the collector of the amplification element 1 and the upper voltage limit $V_2$, while the emitter of the amplification element is connected to the outlet tap 7 of the amplification element and a load 8.

The amplifier generates a current I in the load when the input voltage lies between the lower and the upper voltage limits, which is shown in FIG. 2b. On the presumption that $V_o < V_1 < V_2 < \hat{U}$ the functioning can easy be deduced from the circuit-diagram.

Figure 3:
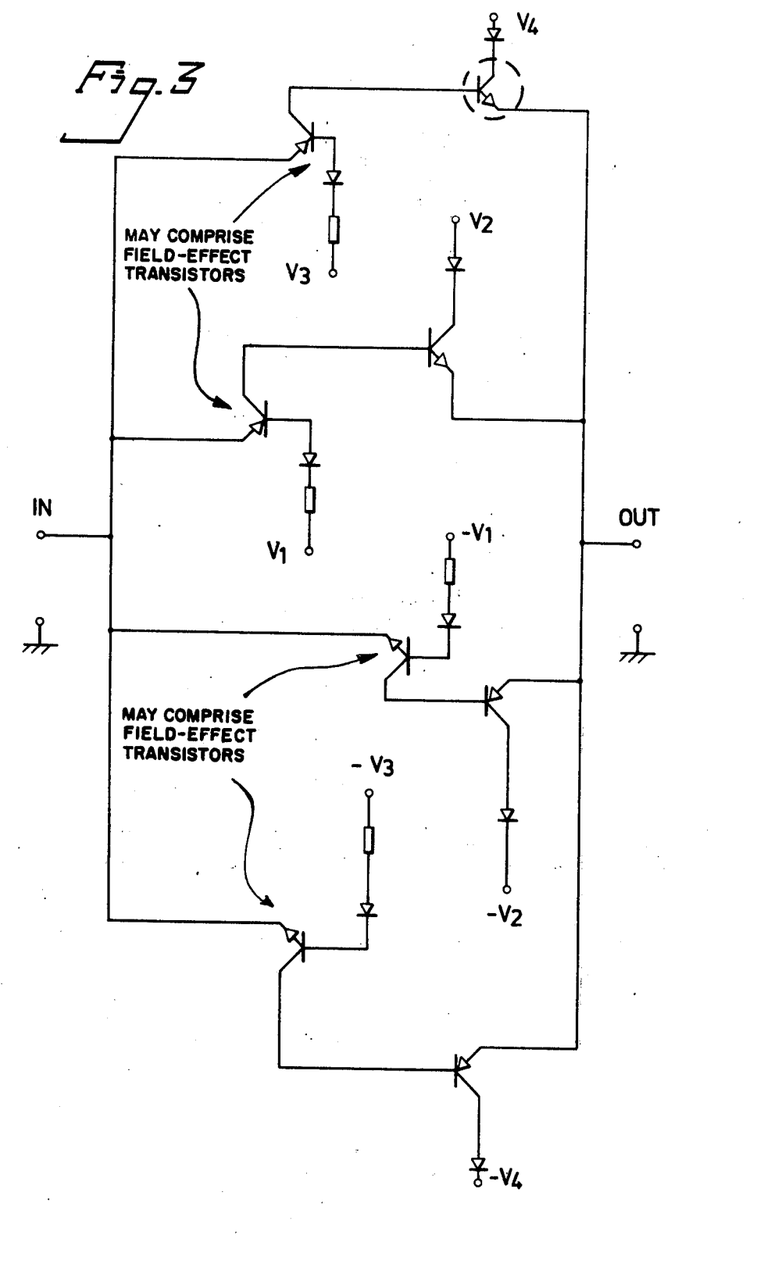
FIG. 3 shows a circuit comprising four elementary amplifiers.

In FIG. 3 an amplification circuit is shown comprising two elementary amplifiers of the type which is shown in FIG. 2 and two elementary amplifiers complementary to said amplifiers. They are connected to have common inlet taps labelled IN and common outlet taps labelled OUT. The voltage limits for the two first elementary amplifiers are designated $V_1$ and $V_2$, and $V_3$ and $V_4$ respectively and the complementary ones are designated $-V_1$ and $-V_2$, and $-V_3$ and $-V_4$ respectively. This type of amplification circuit is used when the input voltage, which is to be amplified, changes its polarity, whereby at least four elementary amplifiers are used.

Figure 4:
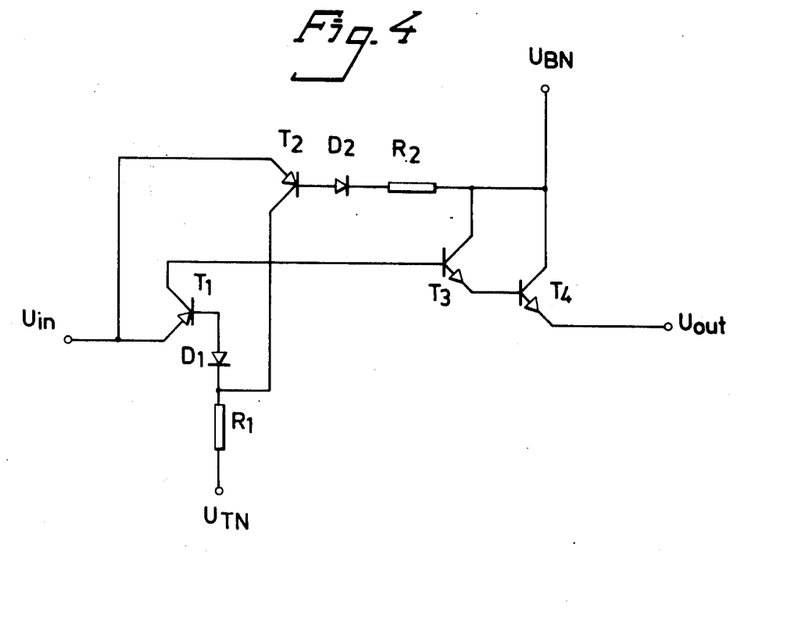
FIG. 4 shows a variant of a transistorized elementary amplifier.
Figure 5:
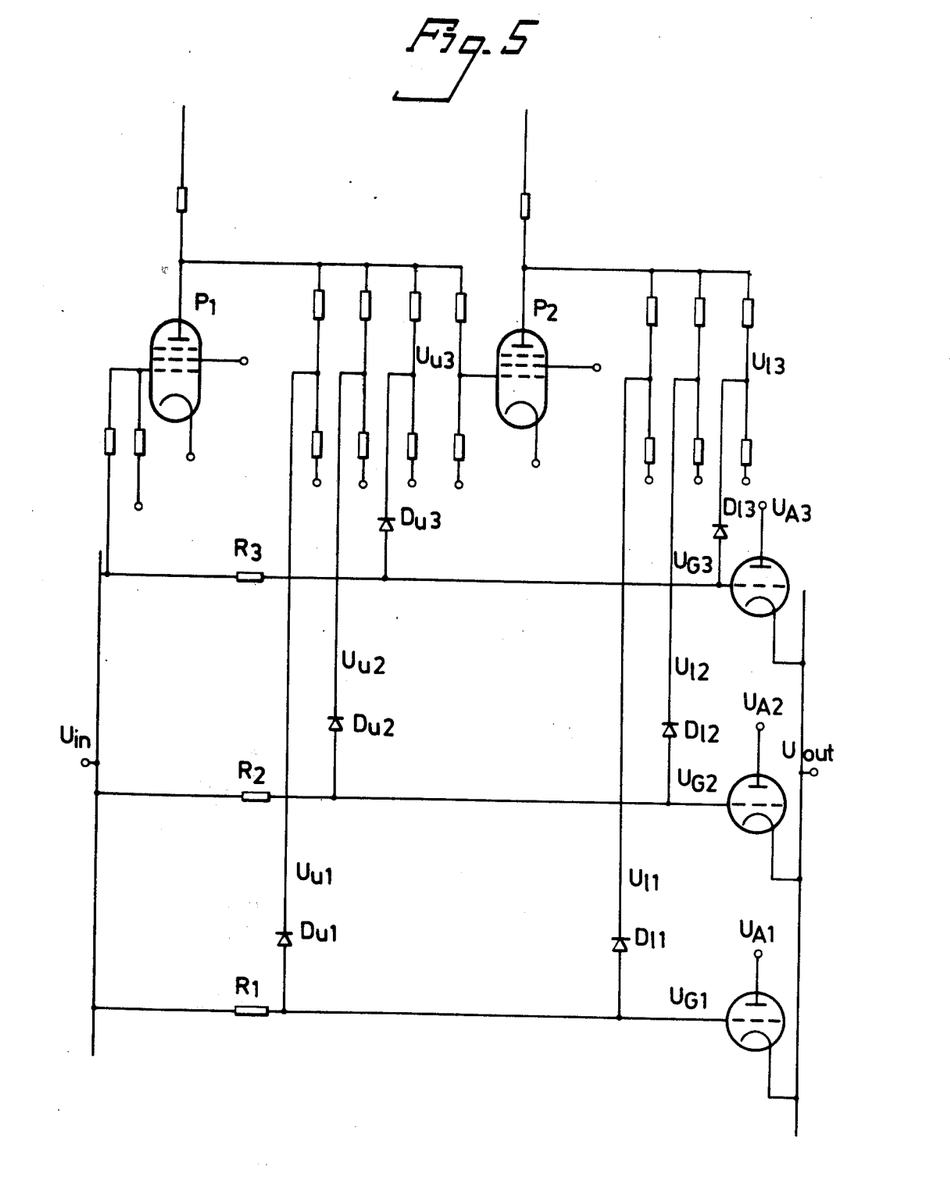
FIG. 5 shows an example of how three elementary amplifiers can be connected and how the gate voltages can be generated when electron tubes are used.

FIG. 4 shows a variant of a transistorized elementary amplifier where a transistor $T_1$ lets through the voltage $U_{in}$ to transistors $T_3$ and $T_4$ when exceeding the voltage $U_{TN}$ but not coming up to the voltage $U_{BN}$. The blocking of the voltage $U_{TN}$ in the transistor $T_1$ is obtained by means of a diode $D_1$ and a resistance $R_1$. By the voltage $U_{BN}$ the blocking of the transistor $T_1$ is obtained by means of a transistor $T_2$, a diode $D_2$ and a resistance $R_2$ blocking via $D_1$ and $R_1$. An example how the amplifier may be constructed when electron tubes are used is shown in FIG. 5. As power amplification element there are used triodes whose cathodes are connected to the outlet and whose anodes are connected each one to its own anode voltage $U_{An}$ (n running numbers). The anode voltages can except D.C. voltage be A.C. voltage, for example three-phase sine wave voltage, whereby every triode in the power stage is completed with two further triodes whose grids respective cathodes are connected in parallel relationship and whose anodes are fed with respective phase voltage. One can also use a two-phase square-voltage with the positive voltage pulse slightly lower and of longer duration than the negative one and in this case feeding the anodes of two triodes.

The grids of the triodes are fed from the input voltage $U_{in}$ via gate resistances $R_n$. The cathodes of two diodes $D_{Ln}$ and $D_{un}$ are connected to each grid of said triodes. A diode $D_{un}$ from each pair of diodes is connected via potentiometer to an inverting D.C. voltage amplifier built around a pentode $P_1$ and is fed with the input voltage $U_{in}$ and generates the upper gate voltage $U_{un}$.

The second diode $D_{Ln}$ from each pair of diodes is connected via potentiometer to a not inverting D.C. voltage amplifier using the amplification in said pentode $P_1$ and a pentode $P_2$ and generates the lower gate voltages $U_{Ln}$.

The lower gate voltages $U_{Ln}$ are adjusted by means of the potentiometers so that at an increasing input voltage $U_{in}$ the diodes $D_{Ln}$ for the lower gate voltages will become currentless in their proper turns.

The upper gate voltages $U_{un}$ are adjusted with help of their potentiometers so that for the same increasing input voltage $U_{in}$ the diodes $D_{un}$ for the upper gate voltages will become current-carrying in their proper turns but in such a way that for each pair of diodes the diode for the upper gate voltage will become current-carrying later than at the time when the diode for the lower gate voltage will become currentless.

The lower gate voltages $U_{Ln}$ must not come up to the anode voltage $U_{An}$ of the respective triode. If the upper gate voltages $U_{un}$ are exceeding the anode voltages, the triodes will work as upper gates when the grid voltages $U_{Gn}$ are exceeding the anode voltage $U_{An}$.

Figure 7:
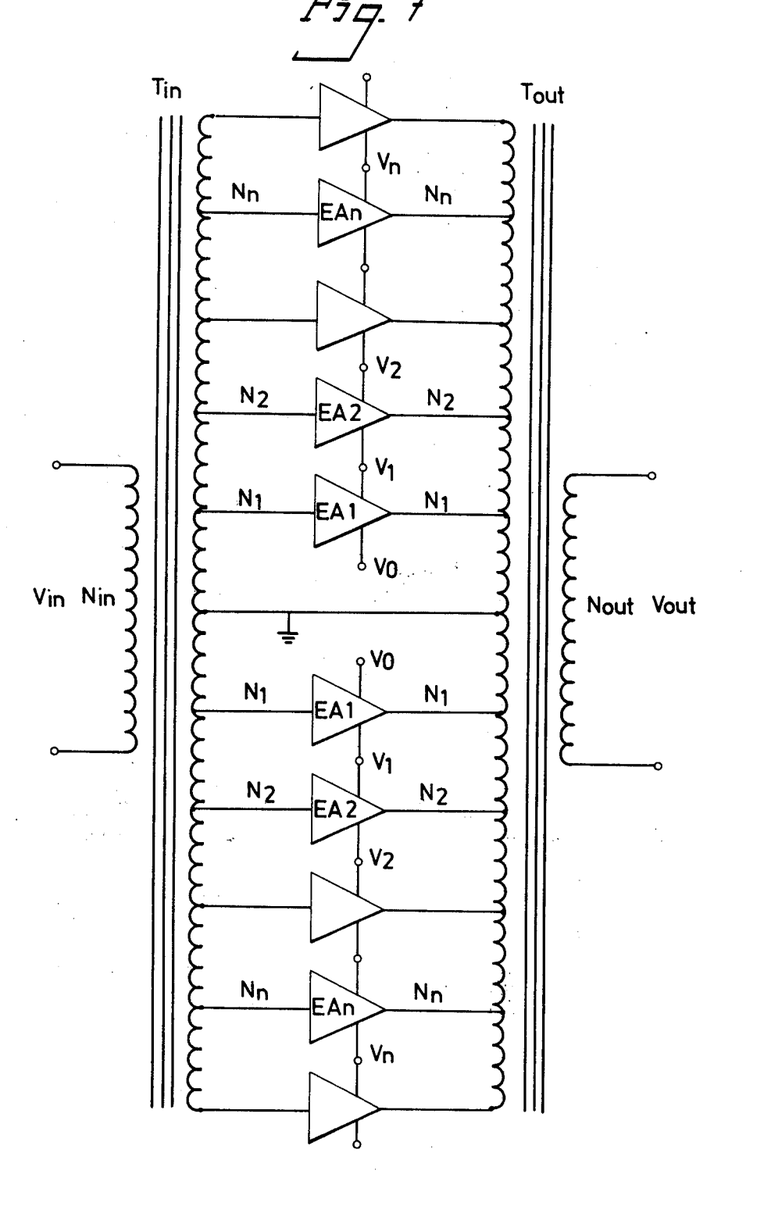
FIG. 7 shows an amplifier circuit where all the elementary amplifiers are connected between taps on transformers.

Input and output transformers can be used in the same way as is shown in FIG. 7.

Figures 6, 6A:
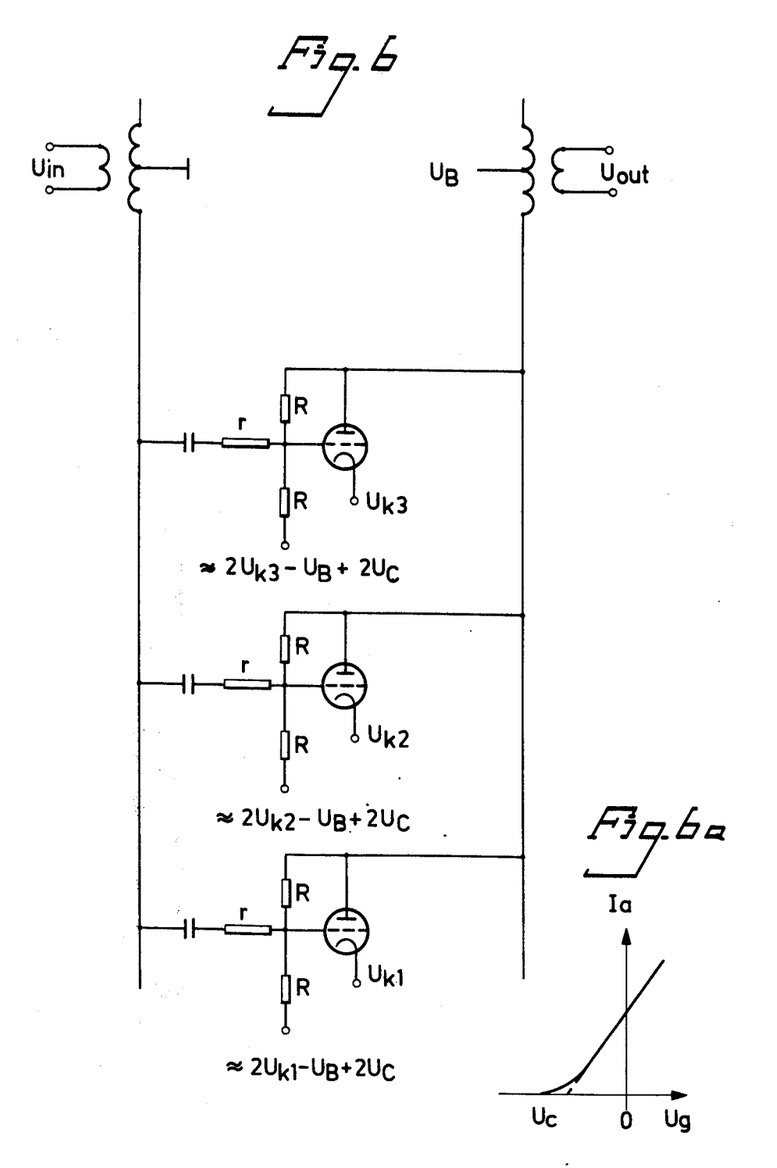
FIG. 6 is a variant of an elementary amplifier built with electron tubes.
FIG. 6a shows the tube characteristic from which the voltage $U_c$ can be derived.

A variant with voltage amplification and with the anodes connected to each other is shown in FIG. 6. This illustrates that there are many types of partial or elementary amplifiers, which together realize the new principle of amplification. In FIG. 6a a tube characteristic for triodes is shown, from which the value $U_c$ can be determined in a way that is evident from the figure. The voltage $U_c$ forms part of the expression $2 U_{Kn} - U_B + 2 U_c$ which is the approximate potential on the grid and where $U_B$ is the feeding or battery voltage and $U_{Kn}$ the potential of the cathode. R indicates resistances connected between anode and grid respectively between cathode and grid. r indicates a resistance between grid and input voltage connected in series with a capacitance.

The amplifier can operate in different ways depending on the properties of the tubes. One way of operation is to choose $U_{k1} = 0$, $U_{k2} = U_B/4$, $U_{k3} = U_B/2$ and to choose the anode load equal to the inner resistance of tube 3. Tube 2 must have the same properties as two parallel tubes 3 and tube 1 the same properties as three parallel tubes 3.

If the grid biasing voltages are finely adjusted so that the tube 2 begins to be current-carrying when the grid of the tube 3 begins to be current-carrying (hence the grid voltage can not increase) and tube 1 begins to be current-carrying when the grid of the tube 2 begins to be current-carrying, a nearly linear ratio between $U_{in}$ and $U_{out}$ is obtained. The feed-back which on account of the resistances originates between the anode and grid of each tube improves the linearity.

In the same way as in the amplifier of FIG. 5, gate diodes and gate amplifiers may as an alternative control the current alternations between the tubes.

FIG. 7 shows a circuit with several partial amplifiers or elementary amplifiers $EA_n$ connected between taps on the secondary winding of an input transformer $T_{in}$ and the primary winding of an output transformer $T_{out}$ whereby each of these partial amplifiers amplifies its own voltage interval. The turns of winding $N_n$ of the different partial amplifiers are so chosen that the load impedance of each elementary amplifier $EA_n$ increases in proportion to its blocking voltage $V_n$. $V_n$ can at the same time be chosen so that all elementary amplifiers will have the same power dissipation (power loss).

The above described circuits are mainly related to resistive loads. If a reactive load is present, this may cause the output current to reverse and $V_{out}$ will become larger than $V_{in}$. According to the present invention the partial amplifiers can be completed by further gates so that the amplifier in its entirety is able to manage also this load case without increasing the losses. As an example FIG. 8 shows a circuit diagram comprising two adjacent elementary amplifiers, of which the amplifier in its entirety is built.

Figure 8:
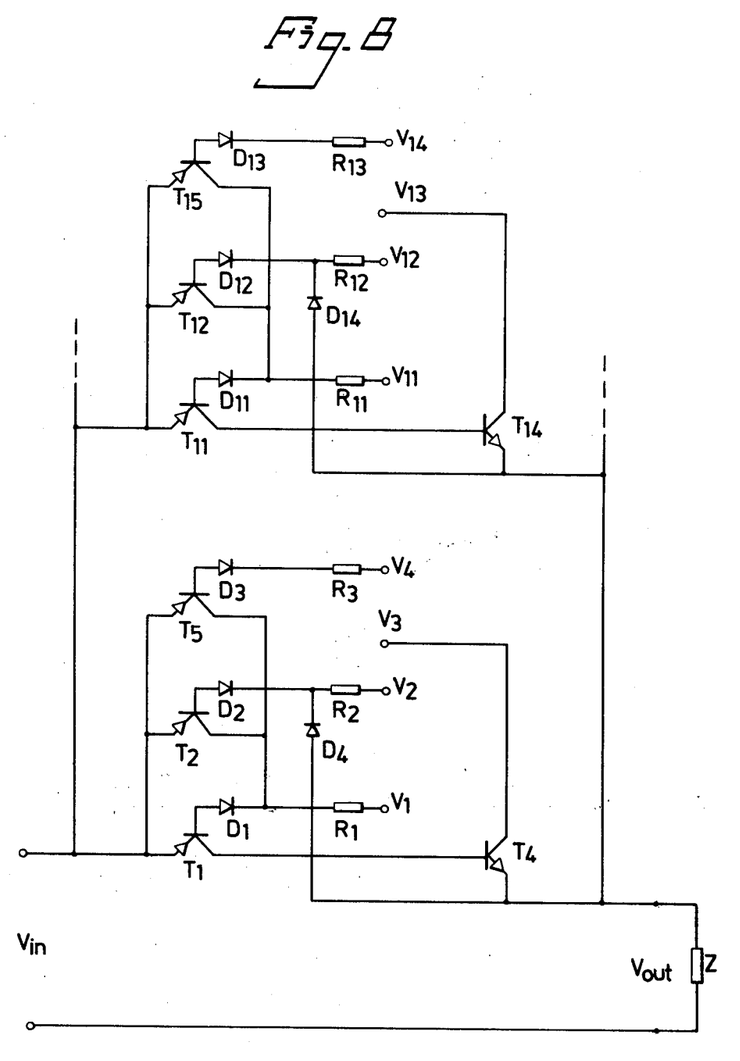
FIG. 8 shows an amplifier circuit intended to work on a reactive load.

The circuit according to FIG. 8 differs from FIG. 4 essentially in that a diode $D_4$ is connected between the emitter of the transistor $T_4$ and the point where $D_2$ and $R_2$ are coupled together. An additional transistor $T_5$ has been connected with its collector and emitter to the collector and emitter respectively of the transistor $T_2$ and with its base via a diode $D_3$ and a resistance $R_3$ to a third gate voltage $V_4$. The transistor $T_3$ has been omitted, and the collector of the transistor $T_4$ has been connected to its own battery voltage $V_3$ with the possibility to generate enough effect and keep the terminal voltage also for currents not flowing in the discharge direction.

$V_1$ and $R_1$ correspond to $U_{TN}$ and $R_1$ in FIG. 4. $V_2$ corresponds to $U_{BN}$ in FIG. 4. In addition a further partial amplifier has been introduced, in which the components have been indicated with indexes, to which 10 has been added.

It is applicable to the voltage sources that $V_1 < V_2 < V_3 < V_4$, and they hold a certain relation to the voltage sources of the other partial or elementary amplifiers so that always at least one partial amplifier is working. The condition for good functioning is that $V_{11}$ should be slightly less than $V_2$ and $V_{13}$ slightly less than $V_4$. Furthermore, $V_{12}$ must be greater than $V_3$. Hence the relations are $V_1 < V_{11} < V_2 < V_3 < V_{12} < V_{13} < V_4 < V_{14}$.

When $V_{in}$ exceeds $V_1$, $T_1$ will be conducting and current will flow from $V_3$ via $T_4$ through the load impedance $Z_b$ so that $V_{out}$ will be $V_{in}$ lessened with the potential drops in $T_1$ and $T_4$. When $V_{in}$ exceeds $V_2$, $T_2$ will be conducting and will block the base voltage of $T_1$ so that the current through $T_4$ is broken. Before that it is assumed that the next partial amplifier has started functioning, and it is now assumed that $Z_b$ is such a reactive load that the output current will turn and $V_{out}$ will exceed $V_{in}$.

If $V_{out}$ exceeds $V_{in}$, for example on account of a reactive load, and $V_{in}$ is greater than $V_2$, the blocking of the input voltage via the diode $D_4$ is broken so that $T_1$ will be conducting. Because if $V_{in}$ and $V_{out}$ are greater than $V_3$, $T_1$ will be conducting via the base-collector-diode of $T_4$ and current will flow from the load $Z_b$ through $T_4$ to the voltage source $V_3$. If $V_{in}$ exceeds $V_4$, $T_1$ will be finally cut via $R_3$, $D_3$ and $T_5$, and the current to or from $Z_b$ will be taken over by another partial amplifier.

When $T_4$ is current-carrying in the reverse direction, the base-collector-voltage will be low, whereby the voltage difference $V_{in} - V_3$ to the greatest part will lie over $T_1$. The voltage difference $V_{out} - V_3$ will then to the greatest part lie between emitter and base of $T_4$. The potentials are balanced by the inner feed-back in the loop $D_4$, $D_2$, $T_2$, $D_1$, $T_1$ and $T_4$.

The invention is not limited to the shown and described embodiments but a great number of modifications thereof are possible within the scope of the appended claims.

What is claimed is:

1. An electric amplifier, comprising several partial amplifiers, which are so connected and voltage fed that each of them amplifies a voltage interval of an input voltage, whereby each partial amplifier has its inlets at one side and its outlets at the other side coupled together and connected to a common inlet or outlet respectively, and wherein every partial amplifier comprises at least one amplification component (1; $T_3$ $T_4$) and two gates, of which one (2, 3, 4; $T_1 D_1 R_1$; $P_2 D_{11} R_1$) is blocking those potentials applied to the component that are less than a given first value ($V_1 U_{TN} U_{11}$) but is open for potentials exceeding said value while the other (5; $T_2 D_2 R_2$; $P_1 D_{u1} R_1$) is open for potentials that are less than a given second value ($V_2 U_{BN} U_{u1}$) greater than said first value but is blocking the component for potentials exceeding said second value ($V_2 U_{BN} U_{u1}$) wherein said gate (2, 3, 4; $T_1 D_1 R_1 P_2 D_{11} R_1$) for blocking potentials less than the first value ($V_1 U_{TN} U_{11}$) comprises an active element, connected to the input voltage and to the lower limiting voltage ($V_1 U_{TN} U_{11}$), by a series connection of a diode ($D_1 D_{11}$) and a resistance ($R_1$), and also being connected to an electrode in the amplifier element (1; $T_3 T_4$) of the partial amplifier.

2. Amplifier according to claim 1, characterized in that when comprising a transistorized partial amplifier the inlet tap (6) is connected to the emitter of a pnp-transistor (2), whose base electrode via a diode (3) and a resistor (4) connected in series with the latter is connected to the lower limiting voltage ($V_1$) and whose collector is connected to the base electrode of the amplification component, in this case a npn-transistor (1), whose collector via a diode (5) is connected to the upper limiting voltage ($V_2$), while the emitter is connected to the outlet (7).

3. Amplifier according to claim 2, characterized in that the voltage intervals of the partial amplifiers are overlapping, so that the transistor distortion is reduced.

4. Amplifier according to claim 1, characterized in that the partial amplifier comprises field-effect-transistors.

5. Amplifier according to claim 1, characterized in that the number of partial amplifiers is at least two if the input voltage is positive or negative.

6. Amplifier according to claim 1, characterized in that every partial amplifier has separate battery voltage lying near the respective voltage interval in the amplification range.

7. Amplifier according to claim 1, characterized in that the amplification circuit is provided with feedback.

8. Amplifier according to claim 1, characterized in that the input voltage is amplified in amplifiers ($P_1P_2$, FIG. 5) before it affects the gates ($D_{L1}R_1$; $D_{u1}R_1$).

9. Amplifier according to claim 1, characterized in that the gate (5) for blocking potentials exceeding the upper limiting voltage ($V_2$) consists of a diode, which is connected in series between a bias voltage for the upper limiting voltage ($V_2$) and an electrode in the amplifier element (1) of the partial amplifier.

10. The amplifier of claim 1, wherein the said inlets of each partial amplifier are connected to a tap in a secondary winding of an inlet transformer common to all partial amplifiers and the corresponding outlets are connected to a tap in a primary winding of an output transformer common to all partial amplifiers.

11. The electric amplifier of claim 1, wherein said active element comprises a transistor.

12. The electric amplifier of claim 1, wherein said active element comprises a vacuum tube.

13. Amplifier according to claim 1, characterized in that the number of partial amplifiers is at least four if the input voltage alternates its polarity.

14. An electric amplifier, comprising several partial amplifiers, which are so connected and voltage fed that each of them amplifies a voltage interval of an input voltage, whereby each partial amplifier has its inlets at one side and its outlets at the other side coupled together and connected to a common inlet or outlet respectively, wherein every partial amplifier comprises at least one amplification component (1; $T_3$ $T_4$) and two gates, of which one (2, 3, 4; $T_1 D_1 R_1$; $P_2 D_{11} R_1$) is blocking those potentials applied to the component that are less than a given first value ($V_1 U_{TN} U_{11}$) but is open for potentials exceeding said value while the other (5; $T_2 D_2 R_2$; $P_1 D_{u1} R_1$) is open for potentials that are less than a given second value ($V_2 U_{BN} U_{u1}$) greater than said first value but is blocking the component for potentials exceeding said second value ($V_2 U_{BN} U_{u1}$), characterized in that each partial amplifier, in addition to the two gates giving the blocking limits of the partial amplifier, is provided with further gates of which one ($D_4$, FIG. 7) breaks the blocking, accomplished by the gate at the upper limiting voltage (5; $T_2 D_2 R_2$; $P_1 D_{u1} R_1$) upon the output voltage ($V_{out}$) exceeding the input voltage ($V_{in}$) and the other gate ($T_5 D_3 R_3$) will block the amplification component ($T_4$) upon the output voltage ($V_{out}$) exceeding a preselected voltage ($V_4$).

15. Amplifier according to claim 14, characterized in that the gate ($T_2D_2R_2$; $P_1D_{u1}R_1$) for blocking potentials exceeding the upper limiting voltage ($U_{BN}$; $U_{u1}$) comprises an active component ($T_2P_1$), connected firstly to the input voltage ($U_{in}$), secondly to the upper limiting voltage ($U_{BN}$; $U_{u1}$) by a series connection of a diode ($D_2$) and a resistance ($R_2$) and thirdly to the first gate through a connecting point between resistance ($R_1$) and diode ($D_1$ $D_{11}$), which are connected in series to the active element ($T_1P_2$) in the gate for blocking potentials that are less than the first value.

16. The electric amplifier of claim 14, wherein said partial amplifier inlets are connected to a tap and a secondary winding of an inlet transformer common to all partial amplifiers and the corresponding outlets are connected to a tap in a primary winding of an outlet transformer common to all partial amplifiers.

17. An electric amplifier, comprising at least three partial amplifiers which are so connected and voltage fed that each of them amplifies a voltage interval of an input voltage whereby each partial amplifier has its inlets at one side and its outlets at the other side coupled together and connected to a common inlet or outlet respectively, and wherein each partial amplifier comprises a vacuum tube amplification component having inner resistance characteristics selected such that a first tube has said characteristics equal to those of a parallel combination of three of a third tube and a second tube has said characteristics equal to those of a parallel combination of two of said third tube, and each tube having a resistance connected between an anode and a grid, the value of said resistance being equal to said resistance characteristic of said third tube, said first tube being provided with a zero cathode voltage and said second tube being choosen with a predetermined cathode voltage and said third tube being provided with two times said predetermined cathode voltage, whereby said second tube begins to be current carrying when the grid of said third tube begins to be current carrying and said first tube begins to be current carrying when the grid of said second tube beings to be current carrying.

* * * * *